United States Patent
Shao

(10) Patent No.: US 11,100,876 B2
(45) Date of Patent: Aug. 24, 2021

(54) LATCH CIRCUIT BASED ON THIN-FILM TRANSISTOR, PIXEL CIRCUIT AND DRIVING METHOD, DISPLAY APPARATUS

(71) Applicants: BOE TECHNOLOGY GROUP CO., LTD., Beijing (CN); Hefei BOE Optoelectronics Technology Co., Ltd., Anhui (CN)

(72) Inventor: Xianjie Shao, Beijing (CN)

(73) Assignees: BOE TECHNOLOGY GROUP CO., LTD., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 735 days.

(21) Appl. No.: 16/065,054

(22) PCT Filed: Dec. 13, 2017

(86) PCT No.: PCT/CN2017/115914
§ 371 (c)(1),
(2) Date: Jun. 21, 2018

(87) PCT Pub. No.: WO2018/214478
PCT Pub. Date: Nov. 29, 2018

(65) Prior Publication Data
US 2021/0210040 A1 Jul. 8, 2021

(30) Foreign Application Priority Data
May 24, 2017 (CN) .......................... 201710372771.7

(51) Int. Cl.
*G09G 3/36* (2006.01)
*H03K 3/356* (2006.01)

(52) U.S. Cl.
CPC ..... *G09G 3/3655* (2013.01); *H03K 3/356113* (2013.01); *G09G 2300/0857* (2013.01); *G09G 2310/08* (2013.01)

(58) Field of Classification Search
CPC ......... G09G 3/3655; G09G 2300/0857; G09G 2310/08; H03K 3/356113
See application file for complete search history.

(56) References Cited

U.S. PATENT DOCUMENTS

2001/0052890 A1* 12/2001 Miyazawa ........... G09G 3/3659
345/89
2008/0174538 A1 7/2008 Yasuda et al.
(Continued)

FOREIGN PATENT DOCUMENTS

| CN | 101918995 A | 12/2010 |
|---|---|---|
| CN | 103295546 A | 9/2013 |
| CN | 104575425 A | 4/2015 |

OTHER PUBLICATIONS

The Extended European Search Report in the European Patent Application No. 17894664.6, dated Dec. 22, 2020.
(Continued)

*Primary Examiner* — Chanh D Nguyen
*Assistant Examiner* — Ngan T. Pham-Lu
(74) *Attorney, Agent, or Firm* — Intellectual Valley Law, P.C.

(57) ABSTRACT

The present application discloses a thin-film transistor-based latch circuit for latching a data voltage in a pixel circuit. The latch circuit includes an input terminal; a first node; an inverse node; a positive-feedback terminal coupled to the input terminal; a first control sub-circuit coupled respectively to the input terminal, the first node, a first power-supply port configured to be provided with a first voltage, and a second power-supply port configured to be provided with a second voltage; a second control sub-circuit coupled
(Continued)

respectively to the input terminal, the first node, the inverse node, the first power-supply port, and the second power-supply port; and a third control sub-circuit coupled respectively to the inverse node, the positive-feedback terminal, the first power-supply port, and the second power-supply port.

20 Claims, 3 Drawing Sheets

(56) References Cited

U.S. PATENT DOCUMENTS

| | | | |
|---|---|---|---|
| 2008/0238867 A1* | 10/2008 | Maeda | G09G 3/344 345/107 |
| 2008/0315918 A1 | 12/2008 | Luo et al. | |
| 2010/0309173 A1 | 12/2010 | Matsuda et al. | |
| 2012/0162594 A1 | 6/2012 | Tamaki et al. | |
| 2013/0229444 A1 | 9/2013 | Teranishi et al. | |
| 2016/0203767 A1* | 7/2016 | Yamazaki | G09G 3/344 345/211 |
| 2017/0229081 A1 | 8/2017 | Dai | |
| 2019/0096354 A1* | 3/2019 | Chen | G02F 1/13306 |

OTHER PUBLICATIONS

International Search Report & Written Opinion dated Mar. 15, 2018, regarding PCT/CN2017/115914.

* cited by examiner

LATCH CIRCUIT BASED ON THIN-FILM TRANSISTOR, PIXEL CIRCUIT AND DRIVING METHOD, DISPLAY APPARATUS

CROSS-REFERENCE TO RELATED APPLICATION

This application is a national stage application under 35 U.S.C. § 371 of International Application No. PCT/CN2017/115914, filed Dec. 13, 2017, which claims priority to Chinese Patent Application No. 201710372771.7, filed May 24, 2017, the contents of which are incorporated by reference in the entirety.

TECHNICAL FIELD

The present invention relates to display technology, more particularly, to a latch circuit based on thin-film transistor, a pixel circuit having the latch circuit, and driving method thereof and a display apparatus having the pixel circuit.

BACKGROUND

The existing reflective liquid crystal display (LCD) panel adopts memory-in-pixel (MIP) technique to reduce power consumption especially for the LCD display panels used in wearable devices. The LCD display panel in wearable device is typically in small form factor with low refreshing frequency and low color gamut characteristics. The low refreshing frequency leads to a long frame cycle time in pixel image. While PMOS transistor or NMOS transistor in the pixel circuit cannot maintain a pixel-driving voltage stable for the long frame cycle time due to existence of transistor leakage current. MIP technique is provided to solve this problem. As shown in FIG. 1, each pixel circuit structure includes an inverter 10 being inserted between a data line Data and a display driver sub-circuit 11 which is to provide a pixel-driving voltage to drive the pixel PE to display a pixel image. The inverter 10 includes a latch function unit configured to be controlled by gate line Gate to latch a data voltage in the data line Data while refreshing the pixel-driving voltage provided to the PE so that the pixel-driving voltage can be maintained stable for a long time.

However, the inverter used in latest MIP technique requires two CMOS NOT gate devices which are not compatible with amorphous silicon based display panel production. An improved technique is desired.

SUMMARY

In an aspect, the present disclosure provides a thin-film transistor-based latch circuit for latching a data voltage in a pixel circuit. The latch circuit includes a positive-feedback terminal coupled to an input terminal. The latch circuit further includes a first control sub-circuit coupled to the input terminal and a first node. The first control sub-circuit is configured to receive a first voltage from a first power-supply port and a second voltage from a second power-supply port, and to control the first node to be at the second voltage when the input terminal is provided with the first voltage and to control the first node to be at the first voltage when the input terminal is provided with the second voltage. Additionally, the latch circuit includes a second control sub-circuit coupled respectively to the input terminal, the first node, and an inverse node. The second control sub-circuit is configured to control the inverse node to be at the second voltage when the input terminal is provided with the first voltage and to control the inverse node to be the first voltage when the first node is at the first voltage. Furthermore, the latch circuit includes a third control sub-circuit coupled respectively to the inverse node and the positive-feedback terminal. The third control sub-circuit is configured to control the positive-feedback terminal to be at the second voltage when the inverse node is at the first voltage and to control the positive-feedback terminal to be at the first voltage when the inverse node is at the second voltage.

Optionally, the first control sub-circuit includes a first transistor coupled in series via the first node to a second transistor between the first power-supply port and the second power-supply port.

Optionally, the second control sub-circuit includes a third transistor coupled in series via the inverse node to a fourth transistor between the first power-supply port and the second power-supply port.

Optionally, the third control sub-circuit includes a fifth transistor coupled in series via the positive-feedback terminal to a sixth transistor between the first power-supply port and the second power-supply port.

Optionally, the first transistor includes a gate and a first electrode commonly coupled to the first power-supply port, and a second electrode coupled to the first node. The second transistor includes a gate coupled to the input terminal, a first electrode coupled to the first node, and a second electrode coupled to the second power-supply port.

Optionally, the third transistor includes a gate coupled to the first node, a first electrode coupled to the first power-supply port, and a second electrode coupled to the inverse node. The fourth transistor includes a gate coupled to the input terminal, a first electrode coupled to the inverse node, and a second electrode coupled to the second power-supply port.

Optionally, the fifth transistor includes a gate and a first electrode commonly coupled to the first power-supply port, and a second electrode coupled to the positive-feedback terminal. The sixth transistor includes a gate coupled to the inverse node, a first electrode coupled to the positive-feedback terminal, and a second electrode coupled to the second power-supply port.

In another aspect, the present disclosure provides a pixel circuit including a latch circuit described herein.

Optionally, the pixel circuit further includes a pixel capacitor having a pixel electrode and a common electrode. The pixel circuit additionally includes a data-input transistor coupled to a gate line, a data line, and the input terminal of the latch circuit. Furthermore, the pixel circuit includes a first control transistor coupled to the input terminal of the latch circuit, a first signal line, and the pixel electrode of the pixel capacitor. Moreover, the pixel circuit includes a second control transistor coupled to the inverse node of the latch circuit, a second signal line, and the pixel electrode of the pixel capacitor.

Optionally, the data-input transistor has a gate coupled to the gate line, a first electrode coupled to the data line, and a second electrode coupled to the input terminal. The gate line is configured to provide a driving signal to control a connection of the data line to the input terminal to set a data voltage in the data line as a voltage level of the input terminal and latch another voltage level at the inverse node.

Optionally, the first control transistor has a gate coupled to the input terminal, a first electrode coupled to the first signal line, and a second electrode coupled to the pixel electrode of the pixel capacitor. The first control transistor is configured to control a connection of the first signal line to the pixel electrode of the pixel capacitor based on the voltage level at the input terminal and to generate a voltage difference between the pixel electrode and the common electrode for charging the pixel capacitor.

Optionally, the second control transistor has a gate coupled to the inverse node, a first electrode coupled to the second signal line, and a second electrode coupled to the pixel electrode of the pixel capacitor. The second control transistor is configured to control a connection of the second signal line to the pixel electrode of the pixel capacitor based on the another voltage level at the inverse node to generate a voltage difference between the pixel electrode and the common electrode for charging the pixel capacitor.

Optionally, each of the first control transistor and the second control transistor is an N-type thin-film transistor.

In yet another aspect, the present disclosure provides a method of driving the pixel circuit described herein. The method includes supplying a pulse signal with a peak voltage equal to the first voltage to the gate line to control the data-input transistor to pass a data voltage from the data line to the input terminal of the latch circuit. The method further includes latching the data voltage during pulse-off time until the pulse signal is supplied to the gate line again. Additionally, the method includes providing a common voltage signal to the common electrode while transmitting a first clock signal from the first signal line through the first control transistor or a second clock signal from the second signal line through the second control transistor based on the data voltage to maintain a voltage difference between the pixel electrode and the common electrode for charging the pixel capacitor. The common voltage signal is a clock signal correlated to the first clock signal and the second clock signal.

Optionally, the method of latching the data voltage includes, if the data voltage is provided with the first voltage, setting the inverse node to the second voltage; if the data voltage is provided with the second voltage, setting the inverse node to the first voltage.

Optionally, the method of providing the common voltage signal includes making the clock signal to be a same frequency in-phase with the first clock signal and the same frequency out-phase with the second clock signal.

Optionally, the method further includes turning on the first control transistor by the first voltage at the input terminal to connect the first signal line to the pixel electrode of the pixel capacitor to charge the pixel capacitor by the first clock signal in-phase with the common voltage signal. Furthermore, the method includes alternatively turning on the second control transistor by the first voltage at the inverse node to connect the second signal line to the pixel electrode of the pixel capacitor to charge the pixel capacitor by the second clock signal out-phase with the common voltage signal.

Optionally, the method of providing the common voltage signal includes making the clock signal to be a same frequency in-phase with the second clock signal and the same frequency out-phase with the first clock signal.

Optionally, the method further includes turning on the second control transistor by the first voltage at the inverse node to connect the second signal line to the pixel electrode of the pixel capacitor to charge the pixel capacitor by the second clock signal in-phase with the common voltage signal. Additionally, the method includes alternatively turning on the first control transistor by the first voltage at the input terminal to connect the first signal line to the pixel electrode of the pixel capacitor to charge the pixel capacitor by the first clock signal out-phase with the common voltage signal.

In still another aspect, the present disclosure provides a display apparatus including a liquid-crystal display panel with each pixel therein being driven by a pixel circuit described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

A new latch circuit is desired for implementing the inverter to each pixel circuit for improve stability of the pixel-driving circuit especially for low refreshing frequency display panel.

Accordingly, the present disclosure provides, inter alia, a latch circuit based on thin-film transistor, a pixel circuit having the latch circuit and driving method thereof and a display apparatus having the pixel circuit that substantially obviate one or more of the problems due to limitations and disadvantages of the related art.

Figure 1:
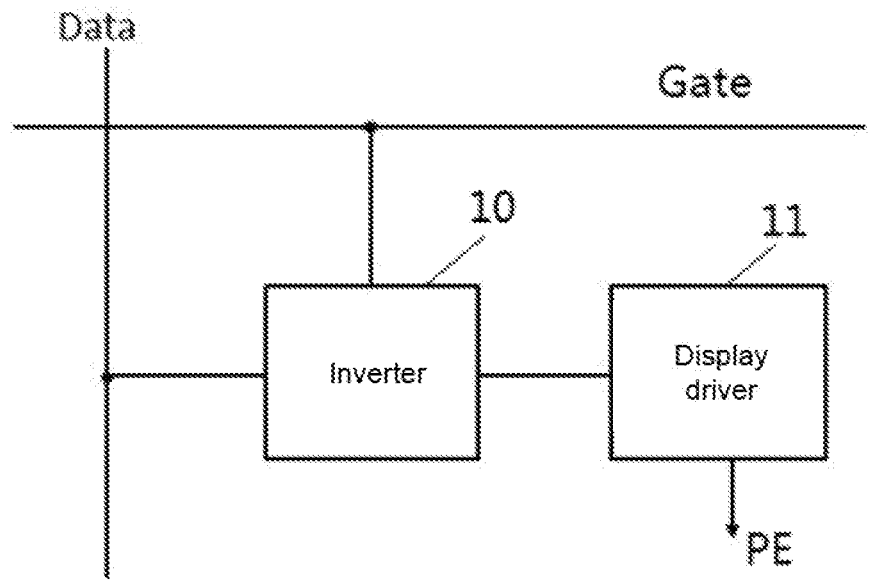
FIG. 1 is a schematic diagram of a pixel-driver structure having an inverter of existing technique.
Figure 2:
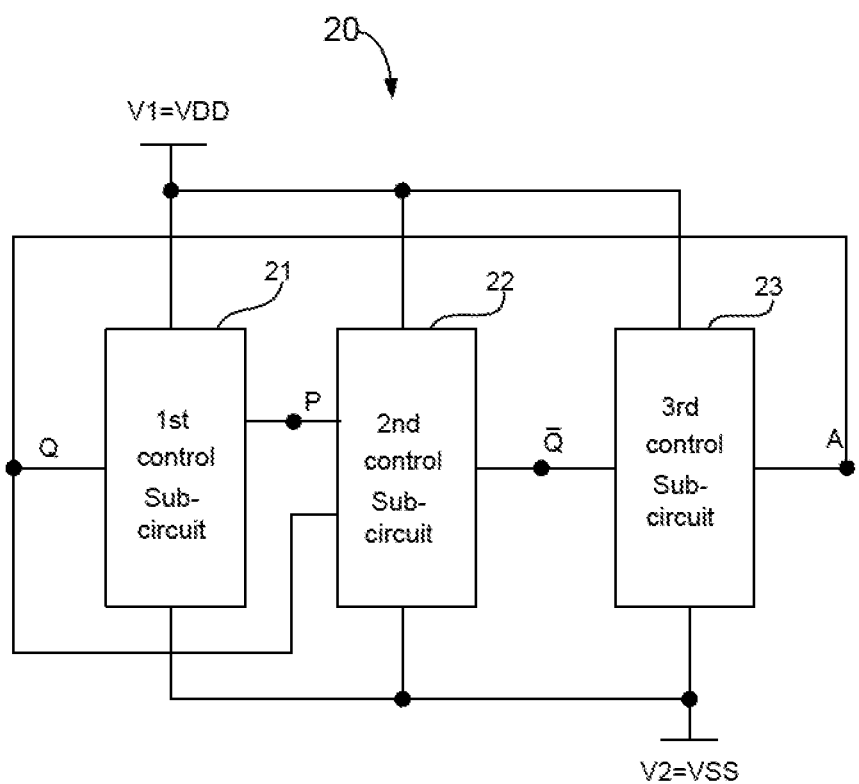
FIG. 2 is a schematic diagram of a latch circuit according to some embodiments of the present disclosure.

In one aspect, the present disclosure provides a latch circuit to be applied in a pixel circuit disposed in a display apparatus. FIG. 2 is a schematic diagram of a latch circuit according to some embodiments of the present disclosure. Referring to FIG. 2, the latch circuit 20 includes an input terminal Q, a first node P, an inverse node $\overline{Q}$, a positive-feedback terminal A, a first control sub-circuit 21, a second control sub-circuit 22, and a third control sub-circuit 23. In particular, the positive-feedback terminal A is connected to the input terminal Q. The first control sub-circuit 21 is coupled respectively to the input terminal Q, the first node P, a first power-supply port configured to be provided with a first voltage V1, and a second power-supply port configured to be provided with a second voltage V2. Optionally, the first voltage V1 is a level equal to or above a turn-on voltage of a NMOS transistor and the second voltage V2 is a level equal to or below a turn-off voltage of a NMOS transistor. Optionally, the first voltage V1 is a high power-supply voltage VDD and the second voltage is a low power-supply voltage VSS (which can be at a grounded level). In an embodiment, the first control sub-circuit 21 is configured to control the first node P to be at the second voltage V2 when the input terminal Q is provided with the first voltage V1 and control the first node P to be at the first voltage V1 when the input terminal Q is provided with the second voltage V2.

Referring to FIG. 2, the second control sub-circuit 22 is coupled respectively to the input terminal Q, the first node P, the inverse node $\overline{Q}$, the first power-supply port, and the second power-supply port. In the embodiment, the second control sub-circuit 22 is configured to control the inverse node $\overline{Q}$ to be at the second voltage V2 when the input terminal Q is provided with the first voltage V1 and control the inverse node $\overline{Q}$ to be the first voltage V1 when the first node P is at the first voltage V1.

Referring to FIG. 2 again, the third control sub-circuit 23 is coupled respectively to the inverse node $\overline{Q}$, the positive-feedback terminal A, the first power-supply port, and the second power-supply port. In the embodiment, the third control sub-circuit 23 is configured to control the positive-feedback terminal A to be at the second voltage V2 when the inverse node $\overline{Q}$ is at the first voltage V1 and control the positive-feedback terminal A to be at the first voltage V1 when the inverse node is at the second voltage V2.

Figure 3:
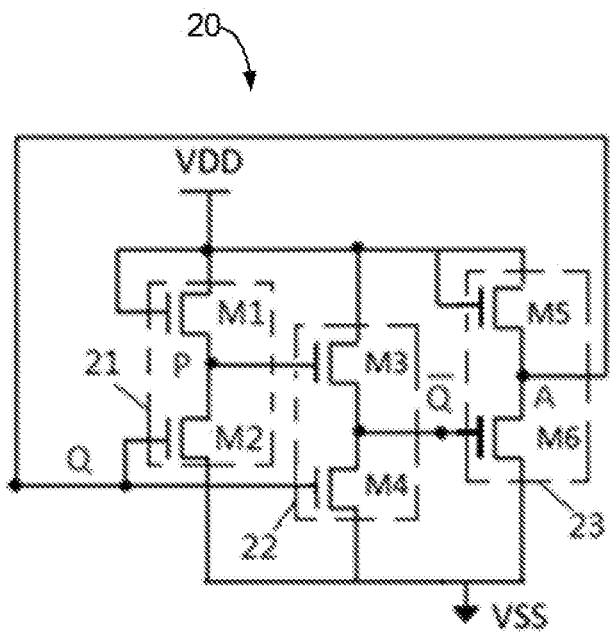
FIG. 3 is a circuit diagram of the latch circuit according to an embodiment of the present disclosure.

In an embodiment as shown in FIG. 3, the latch circuit 20 is specifically formed using thin-film transistors only. In particular each thin-film transistor is an N-type transistor having a gate as a control terminal and a first electrode and a second electrode. Optionally, the first electrode can be a drain and the second electrode can be a source. Alternatively, the first electrode can be a source and the second electrode can be a drain.

Referring to FIG. 3, the first control sub-circuit 21 includes a first transistor M1 coupled in series via the first node P to a second transistor M2 between the first power-supply port VDD and the second power-supply port VSS. The first transistor M1 includes a gate and a first electrode commonly coupled to the first power-supply port VDD, and a second electrode coupled to the first node P. The second transistor M2 includes a gate coupled to the input terminal Q, a first electrode coupled to the first node P, and a second electrode coupled to the second power-supply port VSS. Optionally, each of the first transistor M1 and the second transistor M2 is an N-type transistor (e.g., N-type thin-film transistor).

Referring to FIG. 3, the second control sub-circuit 22 includes a third transistor M3 coupled in series via the inverse node $\overline{Q}$ to a fourth transistor M4 between the first power-supply port VDD and the second power-supply port VSS. The third transistor M3 includes a gate coupled to the first node P, a first electrodecoupled to the first power-supply port VDD, and a second electrode coupled to the inverse node $\overline{Q}$. The fourth transistor includes a gate coupled to the input terminal Q, a first electrode coupled to the inverse node $\overline{Q}$, and a second electrode coupled to the second power-supply port VSS. Optionally, each of the third transistor M3 and the fourth transistor M4 is an N-type transistor (e.g., N-type thin-film transistor).

Referring again to FIG. 3, the third control sub-circuit 23 includes a fifth transistor M5 coupled in series via the positive-feedback terminal A to a sixth transistor M6 between the first power-supply port VDD and the second power-supply port VSS. The fifth transistor M5 includes a gate and a first electrode commonly coupled to the first power-supply port VDD, and a second electrode coupled to the positive-feedback terminal A. The sixth transistor M6 includes a gate coupled to the inverse node $\overline{Q}$, a first electrode coupled to the positive-feedback terminal A. and a second electrode coupled to the second power-supply port VSS. Optionally, each of the fifth transistor M5 and the sixth transistor M6 is an N-type transistor (e.g., N-type thin-film transistor).

In case each of the transistors M1, M2, M3, M4, M5, and M6 is an N-type transistor, the first power-supply port VDD provides a high voltage as a turn-on voltage of an N-type thin-film transistor, i.e., the first voltage V1 is a high voltage. The second power-supply port VSS provides a low voltage as a turn-off voltage of an N-type thin-film transistor, i.e., the second voltage V2 is a low voltage or ground voltage.

In an embodiment, the latch circuit 20 provided in FIG. 3 is able to use N-type thin-film transistors to achieve a latch function with NOT gate and positive-feedback characteristics typically achieved with CMOS circuit. In particular, referring to FIG. 3, as the input terminal Q is provided with a high voltage level which is similar to the first voltage V1 provided from the first power-supply port VDD, both the first transistor M1 and the second transistor M2 are turned on. By properly designing a ratio of width-to-length of the transistor M1 and M2, the voltage level at the first node P is dropped to a low voltage level. Now the third transistor M3 is turned off while the fourth transistor M4 is tinned on. The voltage level at the inverse node $\overline{Q}$ is also dropped to a low voltage level substantially the same as that provided to the second power-supply port VSS. The sixth transistor M6 is turned off while the fifth transistor M5 is turned on. The voltage level at the positive-feedback terminal A is a high voltage level substantially the same as that provided to the first power-supply port VDD. Since the positive-feedback terminal A is connected to the input terminal Q, the high voltage level at the positive-feedback terminal A makes the input terminal Q at the high voltage level, forming a positive feedback and achieving a latch function.

When the input terminal Q is provided with a low voltage level, the second transistor M2 is turned off and the first transistor is turned on by the high voltage provided from the first power-supply port VDD. Thus, the voltage level at the first node P is a high voltage level. The third transistor M3 then is turned on while the fourth transistor M4 is turned off. Now the voltage level at the inverse node $\overline{Q}$ is raised to a high voltage level. Both the fifth transistor M5 and the sixth transistor M6 are turned on. By properly designing a ratio of width-to-length of the transistor M5 and M6, the voltage level at the positive-feedback terminal A can be dropped to a low voltage level substantially similar to the low voltage level at the input terminal Q. This achieves a positive feedback between the input terminal Q and the positive-feedback terminal A, in turn achieving a latch function.

In another aspect, the present disclosure provides a pixel circuit containing the latch circuit described herein. The pixel circuit is disposed in a display apparatus and is configured to use the latch circuit of the present disclosure for latching a data voltage from a data line for maintaining a stable charge level in a pixel capacitor for driving a pixel in a liquid-crystal display panel for displaying a pixel image.

Figure 4:
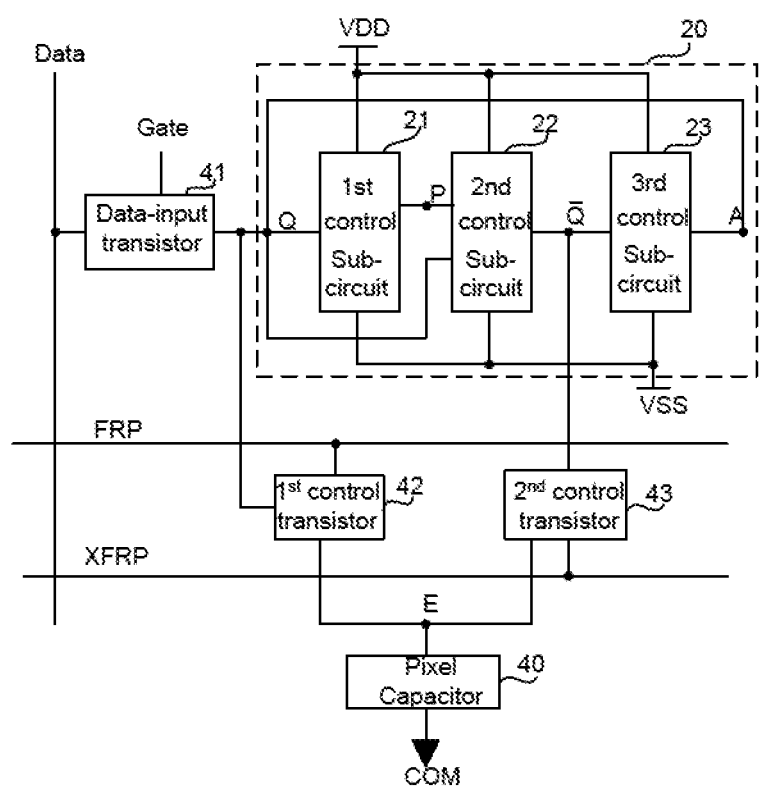
FIG. 4 is a schematic diagram of a pixel circuit according to some embodiments of the present disclosure.

FIG. 4 is a schematic diagram of a pixel circuit according to some embodiments of the present disclosure. Referring to FIG. 4, the pixel circuit includes a data-input transistor 41 controlled by a gate line Gate and coupled between a data line Data and the input terminal Q of the latch circuit 20. The pixel circuit also includes a pixel electrode E and a common electrode COM respectively coupled to a first electrode and a second electrode of a pixel capacitor 40 for storing charges for driving a pixel in a liquid-crystal display panel. Additionally, the pixel circuit includes a first control transistor 42 controlled by the input terminal Q of the latch circuit 20 and coupled between a first signal line FRP and the pixel electrode E. Furthermore, the pixel circuit includes a second control transistor 43 controlled by the inverse node $\overline{Q}$ of the latch circuit 20 and coupled between a second signal line XFRP and the pixel electrode E. The latch circuit 20 has been described in FIG. 2, including a first control sub-circuit 21, a second control sub-circuit 22, and a third control sub-circuit 23 respectively coupled to the input terminal Q, the inverse node $\overline{Q}$, the first node P, the positive-feedback terminal A, the first power-supply port VDD, and the second power-supply port VSS.

Figure 5:
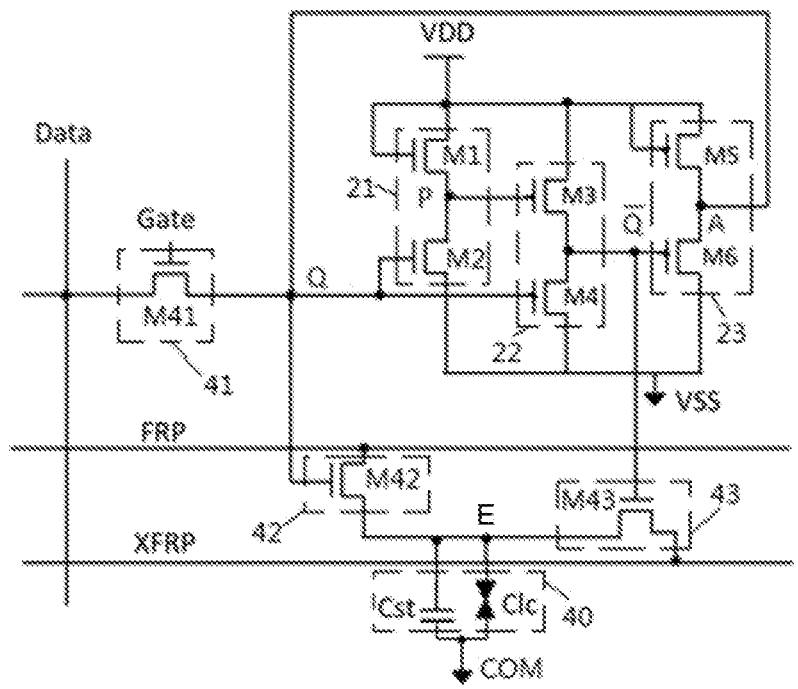
FIG. 5 is an exemplary diagram of the pixel circuit of FIG. 4 according to an embodiment of the present disclosure.

FIG. 5 is an exemplary diagram of the pixel circuit of FIG. 4 according to an embodiment of the present disclosure. Referring to FIG. 5, the data-input transistor M41 includes a gate connected to the gate line Gate, a first electrode coupled to the data line Data, and a second electrode coupled to the input terminal Q. The first control transistor M42 includes a gate coupled to the input terminal Q, a first electrode coupled to the first signal line FRP, and a second electrode coupled to the first electrode of the pixel capacitor 40. The second control transistor M43 includes a gate coupled to the second signal line XFRP, a first electrode coupled to the inverse node $\overline{Q}$, and a second electrode coupled to the first electrode of the pixel capacitor 40. The second electrode of the pixel capacitor 40 is connected to a common electrode COM which is configured to be provided with a common voltage signal. The first electrode of the pixel capacitor 40 is also the pixel electrode E, whose voltage level $V_E$ is determined by the pixel circuit. Optionally, the data-input transistor M41, the first control transistor M42, and the second control transistor M43 can be an N-type transistor. Optionally, they can be NMOS transistors. Optionally, the pixel capacitor 40 includes a storage capacitor Cst and a liquid crystal capacitor Clc coupled in parallel to each other.

For operating the pixel circuit, when the gate line Gate is provided with a high voltage level, the data-input transistor M41 is turned on so that a data voltage in the data line Data is written to the input terminal Q of the latch circuit 20. If the voltage level at the input terminal Q is set to a high voltage level, the first control sub-circuit 21 controls the voltage level at the first node P to be a low voltage level and the second control sub-circuit 22 controls the voltage level at the inverse node $\overline{Q}$ to be a low voltage level and the third control sub-circuit 23 controls the positive-feedback terminal A to be a high voltage level, yielding a positive feedback. Since the input terminal Q connects to the positive-feedback terminal A, the voltage level at the input terminal is latched to the high voltage level. The first control transistor M42 now controls a charging operation from the first signal line FRP to the pixel capacitor 40. In real operation, a voltage signal provided from the first signal line FRP needs to be correlated with a common voltage signal applied to the common electrode COM to ensure a stable voltage difference applied to the pixel capacitor 40.

If the input terminal Q is set to a low voltage level, the first control sub-circuit 21 controls the voltage level at the first node P to be a high voltage level and the second control sub-circuit 22 controls the voltage level at the inverse node $\overline{Q}$ to be a high voltage level and the third control sub-circuit 23 controls the voltage level at the positive-feedback terminal A to be a low voltage level, yielding a positive feedback again but providing a high voltage level at the inverse node $\overline{Q}$. The second control transistor M43 now controls a charging operation from the second signal line XFRP to the pixel capacitor 40. In real operation, a voltage signal provided from the second signal line XFRP needs to be correlated with a common voltage signal applied to the common electrode COM to ensure a stable voltage difference applied to the pixel capacitor 40.

The voltage level at the input terminal Q is either the high voltage level or low voltage level determined by the data voltage in the data line passed through the data-input transistor M41. But no matter what the voltage level at the input terminal Q is, through the operation of the latch circuit 20 using the input terminal Q to control the first control transistor M42 and using the inverse node $\overline{Q}$ to control the second control transistor M43, the pixel capacitor 40 can be properly charged either via the first signal line FRP or the second signal line XFRP to provide a stable voltage at the pixel electrode for driving the pixel to display a pixel image. This pixel circuit is suitable for display apparatus in wearable devices (such as smart watch) especially with low refreshing frequency and low color gamut characteristics. The wearable devices typically require relative long frame time and need grayscale display only.

Figure 6:
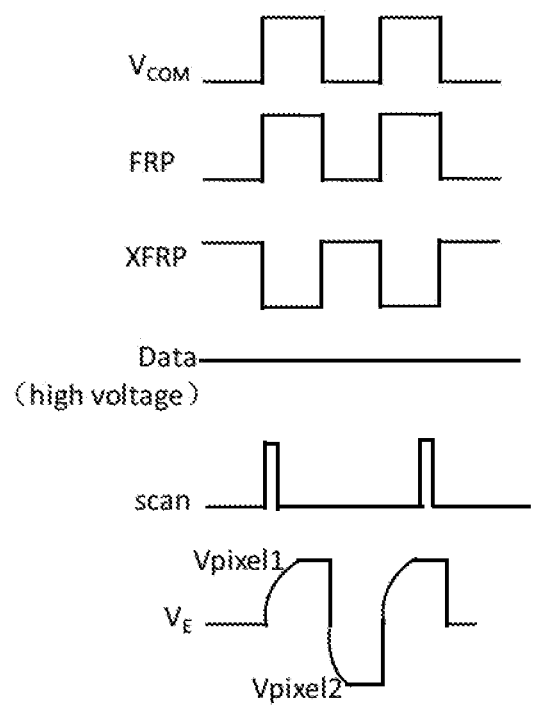
FIG. 6 is a timing waveform of operating the pixel circuit of FIG. 4 according to an embodiment of the present disclosure.

FIG. 6 is a timing waveform of operating the pixel circuit of FIG. 4 according to an embodiment of the present disclosure. Referring to FIG. 6, when the Gate inputs a high voltage signal (a pulse), M41 is turned on to allow the data voltage be passed to the input terminal Q of the latch circuit 20. When the voltage level at the input terminal Q is a high voltage level, M1 and M2 all are turned on. By properly designing a ratio of width-to-length of each of M1 and M2, the voltage level at the first node P can be set as a low voltage level. Now M3 is turned off and M4 is turned on. The voltage level at the inverse node Q is set to a low voltage level. M6 is turned off and M5 is turned on, making the voltage level at the positive-feedback terminal A to be a high voltage level to provide a positive feedback relative to the input terminal Q which is connected to the positive-feedback terminal A with its voltage level being maintained at the high voltage level. The first control transistor M42 can be turned on to charge the pixel through the first signal line FRP, i.e., to charge the pixel capacitor 40 by a voltage signal supplied from the first signal line FRP. Accordingly the voltage level $V_E$ at the first electrode E of the pixel capacitor 40 is charged to Vpixel1.

Alternatively, when the voltage level at the input terminal Q is a low voltage level, M2 is turned off and M is turned on, making the voltage level at the first node P to be a high voltage level. Now M3 is turned on and M4 is turned off so as to make the voltage level at the inverse node $\overline{Q}$ to be a high voltage level. M5 and M6 are turned on. By properly designing a ratio of width-to-length of each of M5 and M6, the voltage level at the positive-feedback terminal A can be set to a low voltage level, yielding a positive feedback relative to the input terminal Q with its voltage level being maintained at the low voltage level. But maintaining the voltage level at the input terminal Q to the low voltage level makes the inverse node $\overline{Q}$ to the high voltage level. Thus, the second control transistor M43 is turned on to charge the pixel through the second signal line XFRP, i.e., to charge the pixel capacitor 40 by a voltage signal supplied from the second signal line XFRP. Accordingly, the voltage level $V_E$ at the pixel electrode E of the pixel capacitor 40 is charged to Vpixel2.

Referring to FIG. 5, when the data-input transistor M41 is turned on, the data voltage in the data line Data (which is either a high voltage or a low voltage) determines that either the first control transistor M42 or the second control transistor M43 is turned on and further determines that pixel capacitor 40 is charged from either the first signal line FRP or the second signal line XFRP. When the data-input transistor M41 is turned off the latch circuit 20 still controls the voltage levels at the input terminal Q and the inverse node $\overline{Q}$ to remain stable to ensure that charging operation to the pixel capacitor remains stable.

Referring to FIG. 6, VCOM is a common voltage signal applied to the common electrode COM of the pixel circuit. As shown, the common voltage signal VCOM is provided as a clock signal. The first signal line FRP is provided with a first clock signal and the second signal line XFRP is provided with a second clock signal. In an embodiment, the common voltage signal VCOM is set as a clock signal substantially the same frequency in-phase with respect to the first clock signal. The second clock signal is set to be substantially the same frequency out-phase with respect to the first clock signal.

In a specific embodiment, by setting the common voltage signal, the first clock signal, and the second clock signal to respective clock signals, the pixel circuit can be operated with substantially low power consumption. In an alternative embodiment, the common voltage signal VCOM is set to a low voltage signal, and the first clock signal and the second clock signal are respectively set as a high voltage signal and a low voltage signal.

In another specific embodiment, the common voltage signal VCOM is set as a clock signal substantially the same frequency in-phase with respect to the second clock signal. The first clock signal is set to be substantially the same frequency out-phase with respect to the second clock signal.

In another aspect, the present disclosure provides a method of driving the pixel circuit described above. In particular, the method includes supplying a pulse signal with a peak voltage equal to the first voltage to the gate line to control the data-input transistor to pass a data voltage from the data line to the input terminal of the latch circuit. The method further includes latching the data voltage during pulse-off time until the pulse signal is supplied to the gate line again. Additionally, the method includes providing a common voltage signal to the common electrode while transmitting a first clock signal from the first signal line through the first control transistor or a second clock signal from the second signal line through the second control transistor based on the data voltage to maintain a voltage difference between the pixel electrode and the common electrode for charging the pixel capacitor. The common voltage signal is set as a clock signal correlated to the first clock signal and the second clock signal.

In the embodiment, the method of latching the data voltage includes, if the data voltage is provided with the first voltage, setting the inverse node to the second voltage; if the data voltage is provided with the second voltage, setting the inverse node to the first voltage.

In the embodiment, the method of providing the common voltage signal includes making the clock signal to be a same frequency in-phase with the first clock signal and the same frequency out-phase with the second clock signal. Additionally, the method includes turning on the first control transistor by the first voltage at the input terminal to connect the first signal line to the pixel electrode of the pixel capacitor to charge the pixel capacitor by the first clock signal in-phase with the common voltage signal and alternatively turning on the second control transistor by the first voltage at the inverse node to connect the second signal line to the pixel electrode of the pixel capacitor to charge the pixel capacitor by the second clock signal out-phase with the common voltage signal.

Alternatively, the method of providing the common voltage signal includes making the clock signal to be a same frequency in-phase with the second clock signal and the same frequency out-phase with the first clock signal. Additionally, the method includes turning on the second control transistor by the first voltage at the inverse node to connect the second signal line to the pixel electrode of the pixel capacitor to charge the pixel capacitor by the second clock signal in-phase with the common voltage signal and alternatively turning on the first control transistor by the first voltage at the input terminal to connect the first signal line to the pixel electrode of the pixel capacitor to charge the pixel capacitor by the first clock signal out-phase with the common voltage signal.

Optionally, each of the data-input transistor, the first control transistor, and the second control transistor is provided as an N-type transistor. Correspondingly, the fst voltage is a high voltage and the second voltage is a low voltage.

In yet another aspect, the present disclosure provides a display apparatus including a liquid-crystal display panel with each pixel therein being driven by a pixel circuit described herein. In one or more implementations, the display apparatus is applied in wearable devices such as smart watch, wearable heart-rate measurement module, wearable satellite navigation module, and others.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term"the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin-film transistor-based latch circuit for latching a data voltage in a pixel circuit, comprising:
   a positive-feedback terminal coupled to an input terminal;
   a first control sub-circuit coupled to the input terminal and a first node, and configured to receive a first voltage from a first power-supply port and a second voltage from a second power-supply port, and to control the first node to be at the second voltage when the input terminal is provided with the first voltage and to control the first node to be at the first voltage when the input terminal is provided with the second voltage;
- a second control sub-circuit coupled respectively to the input terminal the first node, and an inverse node, and configured to control the inverse node to be at the second voltage when the input terminal is provided with the first voltage and to control the inverse node to be the first voltage when the first node is at the first voltage; and
- a third control sub-circuit coupled respectively to the inverse node and the positive-feedback terminal, and configured to control the positive-feedback terminal to be at the second voltage when the inverse node is at the first voltage and to control the positive-feedback terminal to be at the first voltage when the inverse node is at the second voltage.

2. The latch circuit of claim 1, wherein the first control sub-circuit comprises a first transistor coupled in series via the first node to a second transistor between the first power-supply port and the second power-supply port.

3. The latch circuit of claim 2, wherein the first transistor comprises a gate and a first electrode commonly coupled to the first power-supply port, and a second electrode coupled to the first node; the second transistor comprises a gate coupled to the input terminal, a first electrode coupled to the first node, and a second electrode coupled to the second power-supply port.

4. The latch circuit of claim 1, wherein the second control sub-circuit comprises a third transistor coupled in series via the inverse node to a fourth transistor between the first power-supply port and the second power-supply port.

5. The latch circuit of claim 4, wherein the third transistor comprises a gate coupled to the first node, a first electrode coupled to the first power-supply port, and a second electrode coupled to the inverse node; the fourth transistor comprises a gate coupled to the input terminal, a first electrode coupled to the inverse node, and a second electrode coupled to the second power-supply port.

6. The latch circuit of claim 1, wherein the third control sub-circuit comprises a fifth transistor coupled in series via the positive-feedback terminal to a sixth transistor between the first power-supply port and the second power-supply port.

7. The latch circuit of claim 6, wherein the fifth transistor comprises a gate and a first electrode commonly coupled to the first power-supply port, and a second electrode coupled to the positive-feedback terminal; the sixth transistor comprises a gate coupled to the inverse node, a first electrode coupled to the positive-feedback terminal, and a second electrode coupled to the second power-supply port.

8. A pixel circuit comprising a latch circuit of claim 1.

9. The pixel circuit of claim 8, further comprising:
- a pixel capacitor having a pixel electrode and a common electrode;
- a data-input transistor coupled to a gate line, a data line, and the input terminal of the latch circuit;
- a first control transistor coupled to the input terminal of the latch circuit, a first signal line, and the pixel electrode of the pixel capacitor; and
- a second control transistor coupled to the inverse node of the latch circuit, a second signal line, and the pixel electrode of the pixel capacitor.

10. The pixel circuit of claim 9, wherein the data-input transistor has a gate coupled to the gate line, a first electrode coupled to the data line, and a second electrode coupled to the input terminal, and the gate line is configured to provide a driving signal to control a connection of the data line to the input terminal to set a data voltage in the data line as a voltage level of the input terminal and latch another voltage level at the inverse node.

11. The pixel circuit of claim 10, wherein the first control transistor has a gate coupled to the input terminal, a first electrode coupled to the first signal line, and a second electrode coupled to the pixel electrode of the pixel capacitor, and is configured to control a connection of the first signal line to the pixel electrode of the pixel capacitor based on the voltage level at the input terminal and to generate a voltage difference between the pixel electrode and the common electrode for charging the pixel capacitor.

12. The pixel circuit of claim 10, wherein the second control transistor has a gate coupled to the inverse node, a first electrode coupled to the second signal line, and a second electrode coupled to the pixel electrode of the pixel capacitor, and is configured to control a connection of the second signal line to the pixel electrode of the pixel capacitor based on the another voltage level at the inverse node to generate a voltage difference between the pixel electrode and the common electrode for charging the pixel capacitor.

13. The pixel circuit of claim 9, wherein each of the first control transistor and the second control transistor is an N-type thin-film transistor.

14. A method of driving the pixel circuit of claim 8, the method comprising:
- supplying a pulse signal with a peak voltage equal to the first voltage to the gate line to control the data-input transistor to pass a data voltage from the data line to the input terminal of the latch circuit;
- latching the data voltage during pulse-off time until the pulse signal is supplied to the gate line again;
- providing a common voltage signal to the common electrode while transmitting a first clock signal from the first signal line through the first control transistor or a second clock signal from the second signal line through the second control transistor based on the data voltage to maintain a voltage difference between the pixel electrode and the common electrode for charging the pixel capacitor, wherein the common voltage signal is a clock signal correlated to the first clock signal and the second clock signal.

15. The method of claim 14, wherein the latching the data voltage comprises, if the data voltage is provided with the first voltage, setting the inverse node to the second voltage; if the data voltage is provided with the second voltage, setting the inverse node to the first voltage.

16. The method of claim 15, wherein the providing the common voltage signal comprises making the clock signal to be a same frequency in-phase with the first clock signal and the same frequency out-phase with the second clock signal.

17. The method of claim 16, further comprising turning on the first control transistor by the first voltage at the input terminal to connect the first signal line to the pixel electrode of the pixel capacitor to charge the pixel capacitor by the first clock signal in-phase with the common voltage signal; alternatively turning on the second control transistor by the first voltage at the inverse node to connect the second signal line to the pixel electrode of the pixel capacitor to charge the pixel capacitor by the second clock signal out-phase with the common voltage signal.

18. The method of claim 15, wherein the providing the common voltage signal comprises making the clock signal to be a same frequency in-phase with the second clock signal and the same frequency out-phase with the first clock signal.

19. The method of claim 18, further comprising turning on the second control transistor by the first voltage at the inverse node to connect the second signal line to the pixel electrode of the pixel capacitor to charge the pixel capacitor by the second clock signal in-phase with the common voltage signal and alternatively turning on the first control transistor by the first voltage at the input terminal to connect the first signal line to the pixel electrode of the pixel capacitor to charge the pixel capacitor by the first clock signal out-phase with the common voltage signal.

20. A display apparatus comprising a liquid-crystal display panel with each pixel therein being driven by a pixel circuit of claim 8.

* * * * *